(12) United States Patent
Stava (10) Patent No.: US 9,833,948 B2
(45) Date of Patent: Dec. 5, 2017

(54) 3D PRINTING OF COLORED MODELS ON MULTI-HEAD PRINTERS

(71) Applicant: Adobe Systems Incorporated

(72) Inventor: Ondrej Stava, San Jose, CA (US)

(73) Assignee: ADOBE SYSTEMS INCORPORATED, San Jose, CA (US)

( * ) Notice: Subject to any disclaimer, the term of this patent is extended or adjusted under 35 U.S.C. 154(b) by 730 days.

(21) Appl. No.: 14/272,685

(22) Filed: May 8, 2014

(65) Prior Publication Data

US 2015/0321425 A1   Nov. 12, 2015

(51) Int. Cl.
| | |
|---|---|
| *B33Y 50/02* | (2015.01) |
| *B33Y 50/00* | (2015.01) |
| *B41J 3/407* | (2006.01) |
| *G05B 19/4099* | (2006.01) |
| *B33Y 10/00* | (2015.01) |
| *G06F 17/50* | (2006.01) |
| *B29C 67/00* | (2017.01) |
| *G03F 7/00* | (2006.01) |
| *G06F 3/12* | (2006.01) |
| *B33Y 30/00* | (2015.01) |

(52) U.S. Cl.
CPC .......... *B29C 67/0055* (2013.01); *B33Y 10/00* (2014.12); *B33Y 30/00* (2014.12); *B33Y 50/00* (2014.12); *B33Y 50/02* (2014.12); *B41J 3/4073* (2013.01); *G05B 19/4099* (2013.01); *G06F 17/50* (2013.01); *B29C 67/00* (2013.01); *G03F 7/00* (2013.01); *G06F 3/12* (2013.01)

(58) Field of Classification Search
None
See application file for complete search history.

(56) References Cited

U.S. PATENT DOCUMENTS

| | | | | |
|---|---|---|---|---|
| 6,165,406 A | * | 12/2000 | Jang ..................... | B29C 67/0081 264/308 |
| 2015/0266244 A1 | * | 9/2015 | Page ..................... | B22F 3/1055 425/78 |

* cited by examiner

*Primary Examiner* — Qing Wu
(74) *Attorney, Agent, or Firm* — Wolfe-SBMC (57) ABSTRACT

This document describes techniques and apparatuses for 3D printing for colored models on multi-head fused-deposition modeling (FDM) printers. These techniques are capable of enabling FDM printers to create 3D objects based on colored models, in some cases by determining printer instructions for multiple printer heads based on a 3D model and color data for the surface of the 3D model. These techniques can also tailor printer instructions to characteristics of a particular type or individual FDM 3D printer.

23 Claims, 10 Drawing Sheets

3D PRINTING OF COLORED MODELS ON MULTI-HEAD PRINTERS

BACKGROUND

Current techniques for three-dimensional (3D) printing include photopolymerization, granular-materials binding, and fused deposition modeling. In the case of fused deposition modeling, layers of material, such as sugar, plastic, or metal, are extruded, often in the form of small beads that make up strings, also called "filaments." Through extruding layer after layer of these filaments a 3D object is created.

Current fused-deposition printing techniques often rely on computer models that are defined by their surface representation while colors, if any, are stored as a color map or texture for later mapping onto the surface. Converting the surface representation and color data into printer instructions, however, can be difficult or impossible for current techniques.

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

SUMMARY

This document describes techniques and apparatuses for 3D printing for colored models on multi-head printers. These techniques are capable of enabling fused-deposition printers to create 3D objects based on colored models, in some cases by determining printer instructions for multiple printer heads based on a three-dimensional (3D) model and color data for the surface of the 3D model. In contrast to some current techniques, the techniques described in this document can create printer instructions to print a 3D object corresponding to an input model having a nearly unlimited number and orientation of colors. Further, these techniques can tailor printer instructions to characteristics of a particular type or individual fused-deposition modeling (FDM) 3D printer.

This Summary introduces a selection of concepts in a simplified form that are further described below in the Detailed Description. As such, this Summary is not intended to identify essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit of a reference number identifies the figure in which the reference number first appears. The use of the same reference numbers in different instances in the description and the figures indicate similar or identical items.

DETAILED DESCRIPTION

Conventional techniques and apparatuses for three-dimensional (3D) printing are often unable to determine printer instructions based on a three-dimensional (3D) model and color data for the surface of the 3D model. Some multi-colored models, for example, cannot be converted into a unified input model. Instead, current techniques create separate models for each single-colored object. These separate models can then be combined. These combined, separate models, however, only work for a limited number and type of object, such as one where each object of each color can be printed separately. Further, even in the limited cases where a multi-colored model can be broken into separate models based on each having a single color, the computational complexity to create these models can be high, the print speeds using these models can be low, and the final quality of the printed object using these models can be lower than desired.

This disclosure describes techniques and apparatuses capable of creating printer instructions based on a 3D model and color data for the surface of the 3D model. The computational complexity to create these printer instructions can be relatively low, the print speeds when printing the object can be relatively high, or the final quality of the printed object can be high, with a resulting object closely resembling the 3D model and its surface colors.

In various examples set forth below, the techniques determine printer instructions that enable creation of 3D objects corresponding to 3D models and surface colors. In some of these examples, the techniques create an input model having the 3D model and color, slice the model to obtain perimeters and colors at those perimeters, and then determine printer instructions per slice to create layer-by-layer printing instructions. Alternatively or additionally, in some examples a type or even an individual fused-deposition-modeling (FDM) 3D printer's characteristics are used to tailor these instructions, such as a number of printer heads indicating a maximum number of colors for printing. Other aspects of the techniques, such as determining areas of print layers to print in various colors, even if those areas are not all visible in a final 3D object, are also described.

The discussion now turns to an operating environment, techniques that may be employed in the operating environment, and a System-on-Chip (SoC) in which components of the operating environment can be embodied. In the discussion below, reference is made to the operating environment by way of example only.

Operating Environment

Figure 1:
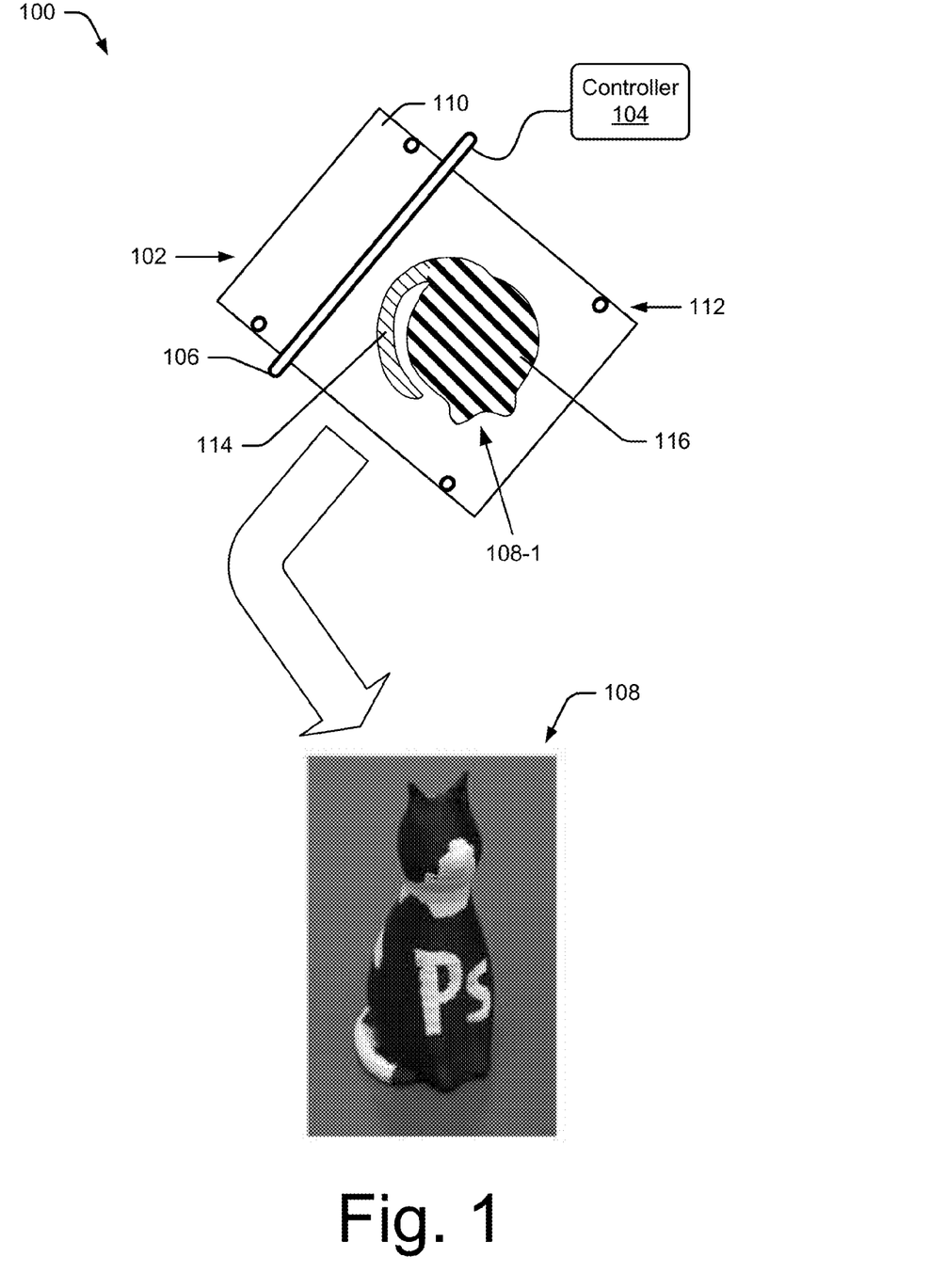
FIG. 1 illustrates an operating environment having a 3D printer, a controller, and a filament-providing element building a 3D object.

FIG. 1 illustrates an operating environment 100 that includes a 3D printer 102 having a controller 104 and a filament-providing group 106. 3D printer 102 is capable of building a 3D object 108, shown in the process of being printed over a plate 110 at 108-1 and complete at 3D object 108. Here plate 110 remains fixed while filament-providing group 106 is mechanically advanced, though filament-providing group 106 may instead be moved and plate 110 remain fixed (or both may move). 3D printer 102 optionally includes sensors 112, which are capable of measuring 3D object 108-1, such as filament locations, colors, and widths.

Filament-providing group 106 includes two, three, or more filament heads. Filament-providing group 106 is capable of printing filaments with different characteristics, such as filaments with different colors (red, green, and blue, or cyan, magenta, and yellow, or black and white, or black, white, red, green, and blue, and many others), filaments with different sheens (shiny and matte), and different widths.

FIG. 1 illustrates 3D object 108, which is an actual and complete 3D object printed using the techniques described herein. A first few layers of 3D object 108 are shown at 108-1 from a plan view, though these are shown illustrated as line drawings instead of actual printed filaments. Note that, like 3D object 108, a tail section 114 is shown in white and a body section 116 is shown in dark lines (to represent black filaments). As also can be seen with object 108, the techniques enable printing of an object in two colors, in this case, using two printer heads each printing with different colors (one white, one black). Object 108 is but one example, shown simply as an introduction. The techniques are described in greater detail below.

Figure 2:
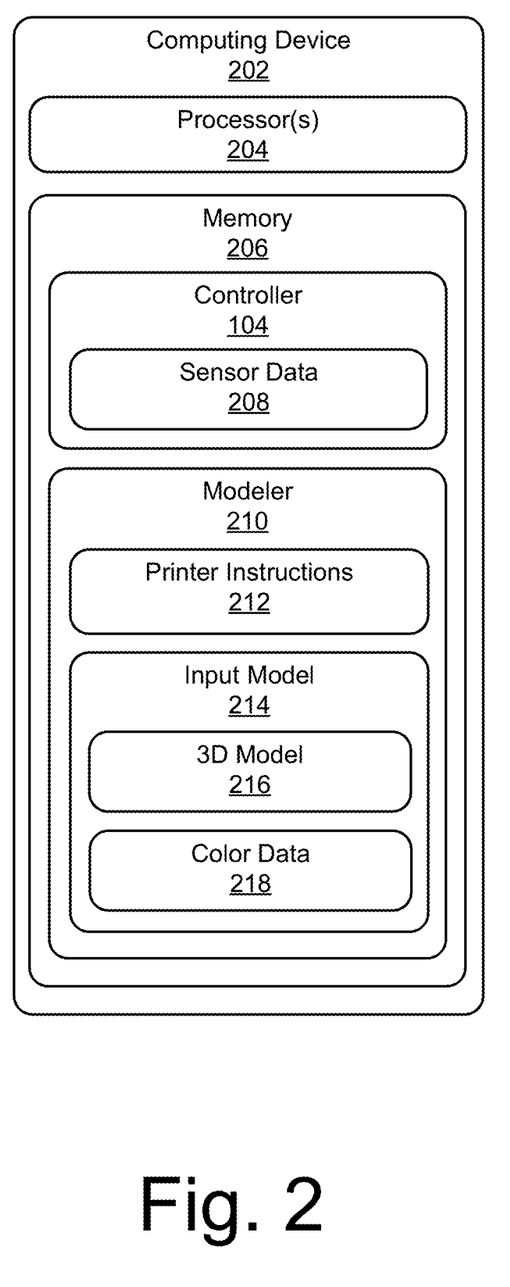
FIG. 2 illustrates a computing device having the controller of FIG. 1 along with a modeler and other elements usable by the techniques.

FIG. 2 is an illustration of a computing device 202 having an example embodiment of controller 104, as well as example elements usable by the techniques. Computing device 202 includes one or more processors 204 and computer-readable storage memory ("memory") 206. Memory 206 includes controller 104, which includes or has access to sensor data 208 (from sensors 112 of FIG. 1), and modeler 210. Controller 104 can control, and/or process data for, 3D printer 102 effective to print 3D objects having multiple colors using a multi-head printer. Controller 104 does so at least in part by following printer instructions 212 created by modeler 210. As noted, controller 104 acts through control of filament-providing group 106 of FIG. 1.

Filament-providing group 106 may extrude filaments, such as continuously or with closely-spaced beads that, when placed, adhere to each other to create filaments. Filaments, however, are not necessarily extruded. Other manners of printing material may be used, including applying previously created filaments, such as from a spool of filament, as well as other manners known in the art for applying materials in 3D printing. Whether or not extruded, filament-providing group 106 may provide filaments having various characteristics, including sheen, color, size, and viscosity. In some embodiments, controller 104 causes filament-providing group 106 to place filaments in non-planar layers, which will be described in greater detail below.

Modeler 210 includes or has access to an input model 214, which can include or be based on a 3D model 216 and color data 218 indicating colors on a surface of 3D model 216. Modeler 210 is capable of determining printer instructions 212 based on input model 214, such as by slicing input model 214 to find exterior perimeters corresponding to the geometry of 3D model 216 and determining, for the exterior perimeters for each slice and colors of color data 218 at the exterior perimeters, areas of colors to be printed in each of the layers. As will be noted in detail below, modeler 210 may also or instead tailor printer instructions 212 to characteristics of an FDM 3D printer.

Modeler 210 may determine or receive desired color data 218, which may be separate from 3D model 216, such as text (e.g., alphanumeric) or a two-dimensional image, color map, or texture map. This color data 218 can be received separate from, or integral with, 3D model 216, such as when an object model includes a colored surface or has object dimensions received separate from surface colors.

Figure 3:
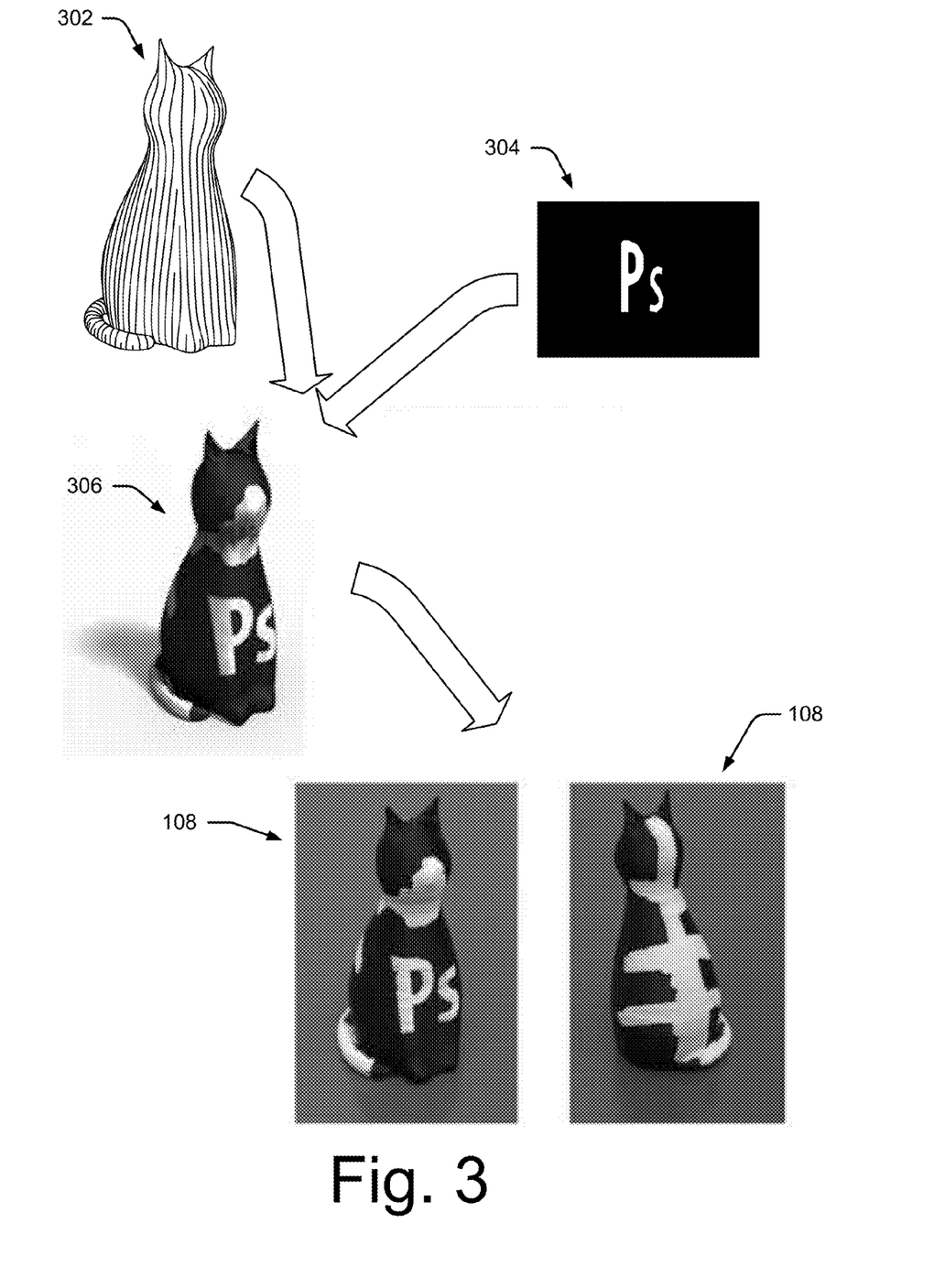
FIG. 3 illustrates a 3D model, color data, an input model, and a printed 3D object.

As an introduction to the concept of color data and models, consider FIG. 3, which illustrates 3D model 302, color data 304, and input model 306. Modeler 210, as described below, determines input model 306 from 3D model 302 and color data 304, here by applying ("mapping") color data 304 to a surface of 3D model 302. For simplicity, color data 304 is shown all black other than a "Ps" text, rather than include the white design on the cat shown on 3D object 108. Based on input model 306, modeler 210 determines printer instructions, which control printer heads of 3D printer 102 through operation of controller 104. The result is shown with 3D object 108 shown in front-facing and rear-facing views.

Ways in which entities of FIGS. 1 and 2 act and interact are set forth in further detail below. While controller 104 and modeler 210 are shown separate and as computer-executable instructions executable by processor(s) 204, they may instead be hardware or firmware, or a combination of hardware, firmware, and/or software, and be integrated or separate.

Techniques for 3D Printing of Colored Models on Multi-Head Printers

As noted above, the techniques enable 3D printing of colored models on multi-head printers. The following methods are described in part using entities and examples of FIGS. 1-3, though this is for example only. Methods described herein can be performed by one or multiple entities, and be combined, in whole or in part. The order shown for operations performed is for example only, and is not intended to limit the techniques.

Figure 4:
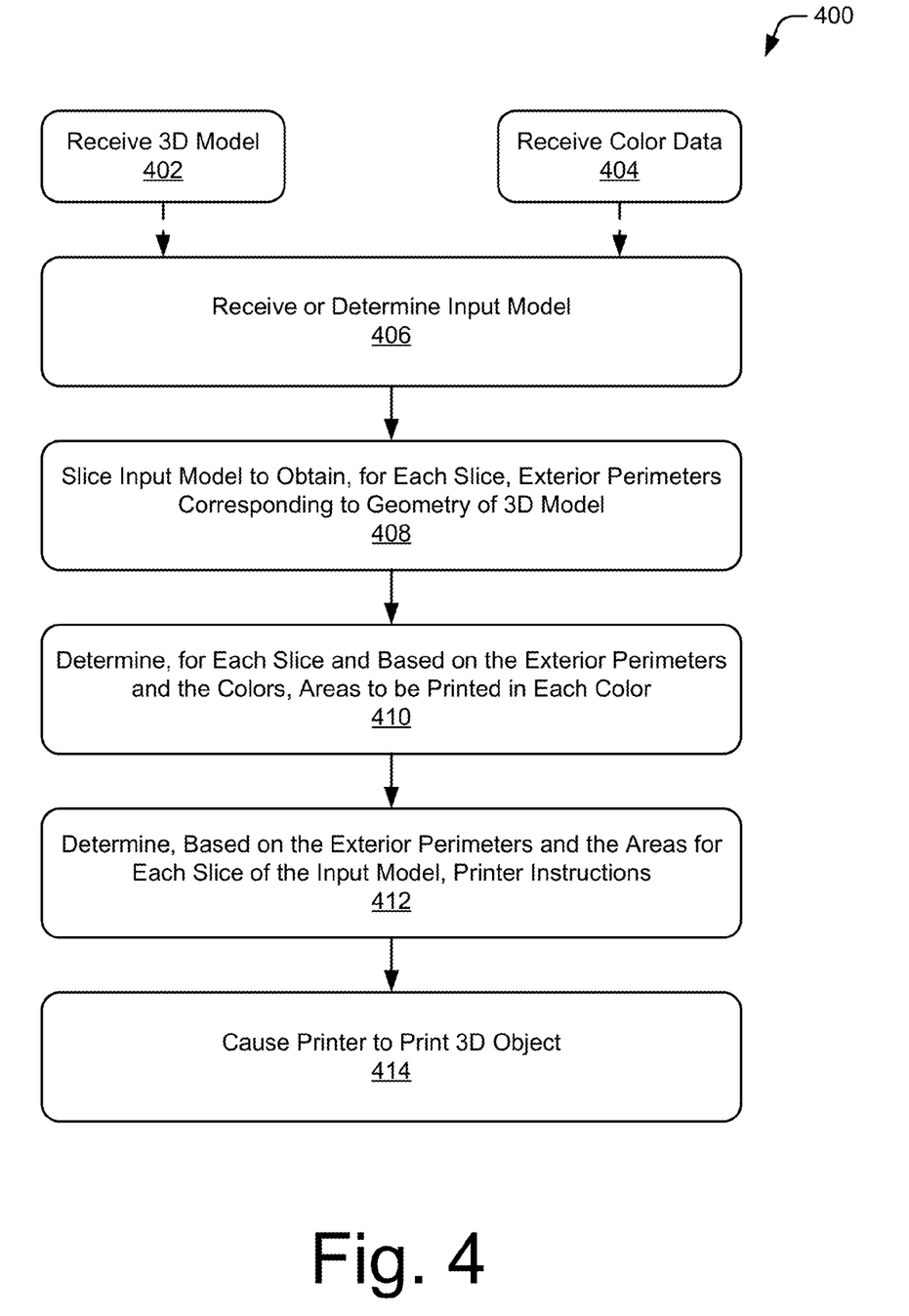
FIG. 4 illustrates example methods for 3D printing of colored models on multi-head printers.

FIG. 4 illustrates example methods 400 that enable 3D printing of colored models on multi-head printers. The techniques may receive an input model or a 3D model and color data by which to determine the input model. Thus, operations 402 and 404 are optional. At 402, the techniques receive a 3D model and, at 404, receive color data associated with the 3D model. At 406, the input model is received or determined from the 3D model and the color data. This input model can include a geometry of the 3D model and the color data indicating colors on a surface of the 3D model. This is illustrated in FIG. 3, which shows 3D model 302 and color data 304 as inputs used to determine input model 306.

As noted in part above, this input model can be a single input model for creation of the 3D object, such as in cases where modeler 210 determines printer instructions 212 capable of controlling multiple printer heads to create the 3D object layer-by-layer rather than printer-head-by-printer-head or sub-object-by-sub-object. Thus, creation of multiple models based on each having a single color and then combining those multiple models can be avoided. In other words, an input model is not needed for each printer head, instead a single "mesh" with color encoded with the 3D model is used. The resulting printer instructions can be a single set of instructions for multiple colors and multiple printer heads.

At 408, the input model is sliced effective to obtain, for each slice, exterior perimeters corresponding to the geometry of the 3D model. This slicing of the input model can performed from an expected first print layer to a last expected print layer, such as from a bottom of the input model to a top of the input model. Note that in some cases modeler 210 reorients the input model to make printing the 3D object faster, with lower processing resources, or for a higher quality, such as to orient layers to avoid surfaces with "step" artifacts, for example.

Figure 5:
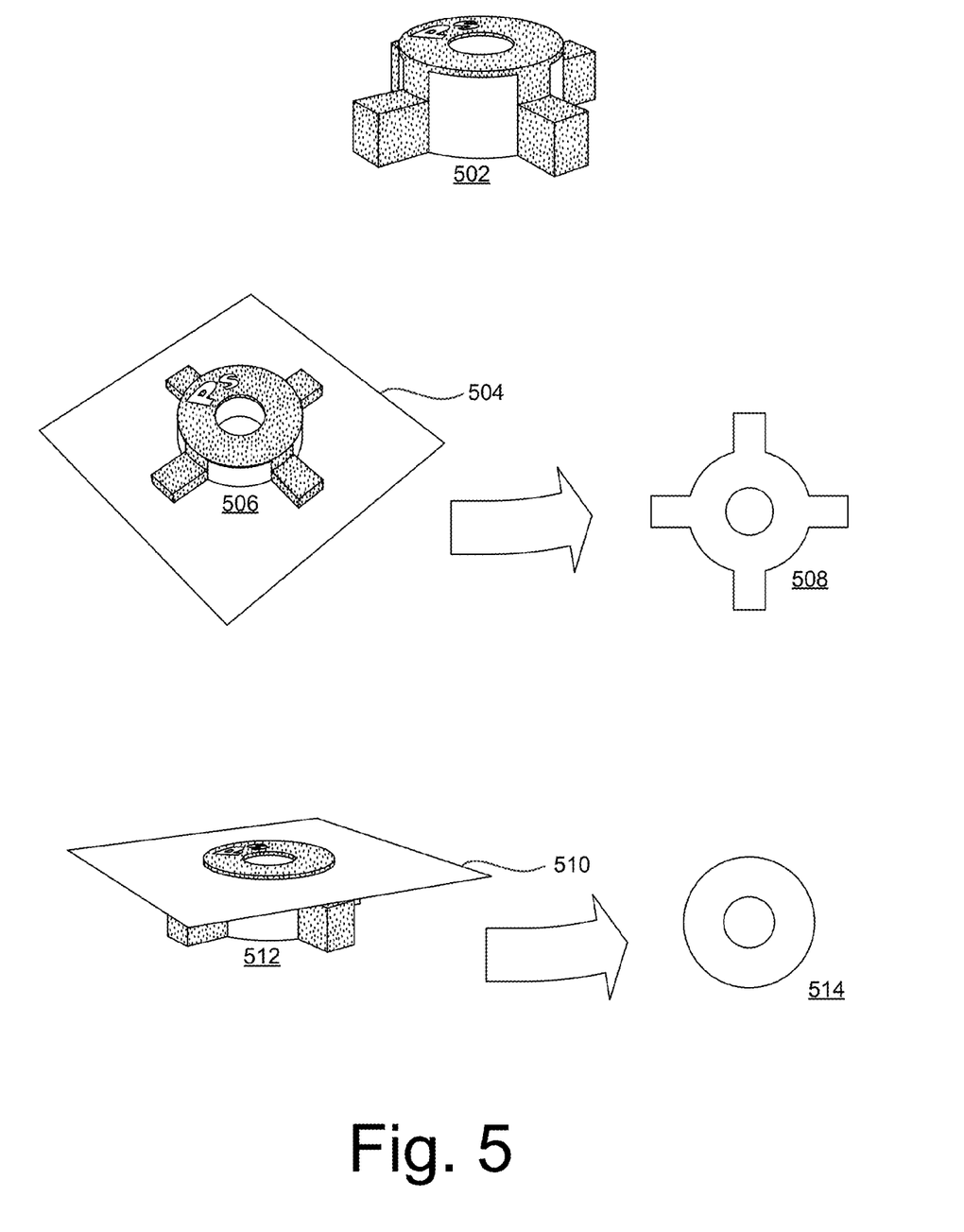
FIG. 5 illustrates examples manners in which to slice an input model, including through intersection of the input model with a horizontal plane.

Other examples manners in which to slice the input model include through intersection of the input model with a horizontal plane. This result of the intersection is then used to determine the exterior perimeters. An example of such a manner is shown in FIG. 5, which illustrates input model 502 intersected at two planes. The first intersection is with a horizontal plane 504 showing an intersected input model 506 having exterior perimeters 508. The second intersection is with a horizontal plane 510 showing an intersected input model 512 having exterior perimeters 514. These exterior perimeters show the geometry of the layer, which is later used to determine printer instructions.

While the above example uses a horizontal plane to slice the input model and then, for these slices, determines printer instructions for layers of filament to print, this is not required. In some cases modeler 210 slices the input model through a non-planar intersection of the input model. This results in a non-planar intersection used to determine the printer instructions, such as for non-planar-layer printing. Non-planar printing can require additional control of filament-providing element 106 and/or printer heads, such as in a Z plane of a printer that prints in the X-Y plane, though doing so can aid in reducing artifacts (e.g., surface steps or flaws) or increasing strength of the 3D object created.

At 410, areas to be printed in each of the colors is determined. These areas are determine for each slice and based on the exterior perimeters and the colors on the surface of the 3D model. As noted, the term "slice" does not require a planar or horizontal intersection of the input model.

Figure 6:
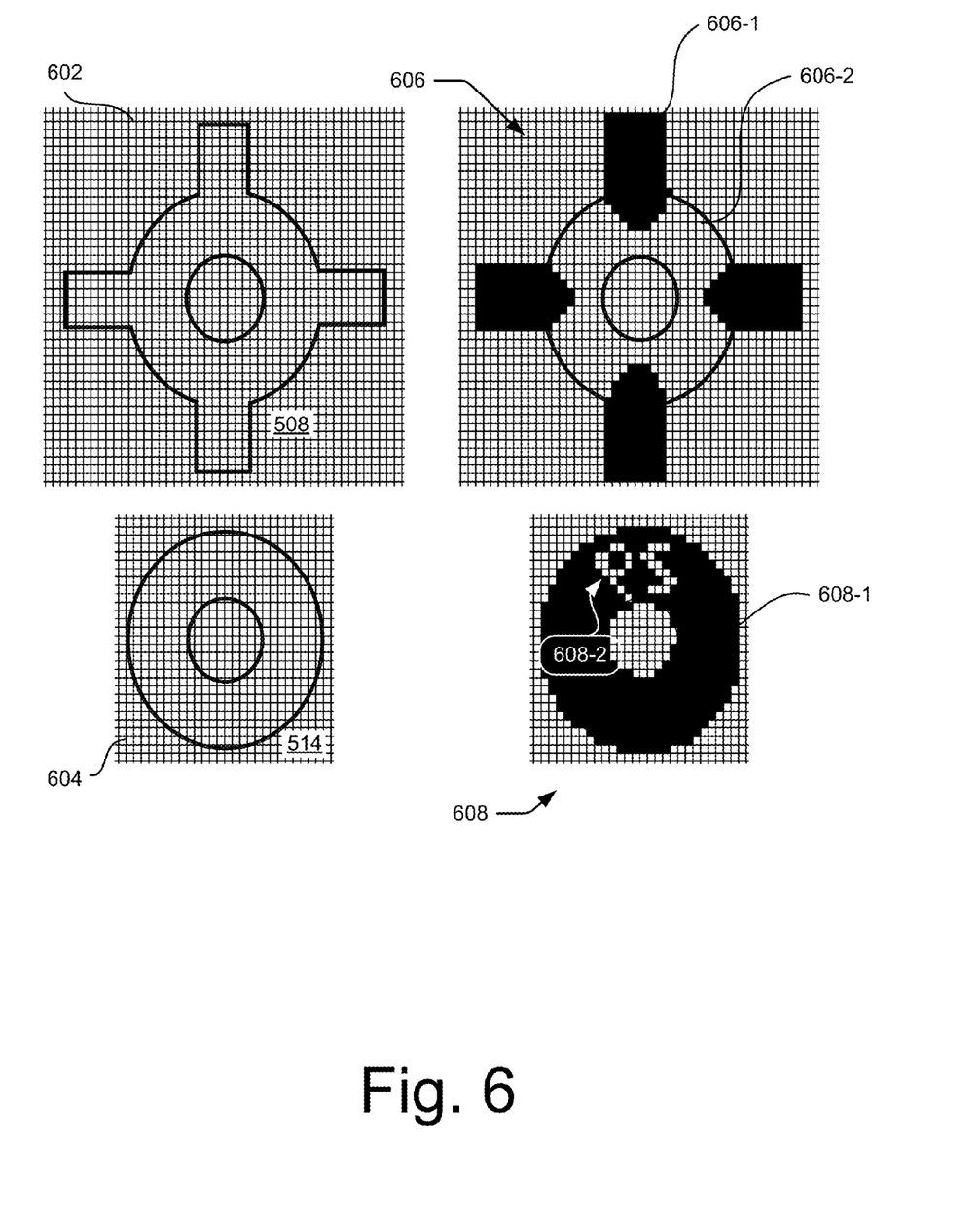
FIG. 6 illustrates a grid overlaying exterior perimeters of FIG. 5 and colors mapped to cells of the grid.

In more detail, modeler 210 may determine areas in various manners, either alone or in combination with each other. For example, modeler 210 may determine the areas to be printed in each of the colors by converting data for the colors into a grid representation and assigning a color for each cell of the grid representation. This is illustrated in FIG. 6 with a grid 602 overlaying exterior perimeter 508 of FIG. 5 and a grid 604 overlaying exterior perimeter 514, also of FIG. 5. Assigning colors to cells of the grid can be performed by computing a nearest point on the surface of the input model for each cell of the grid representation, this is illustrated at areas 606 and 608. Areas 606 include an area 606-1 in one color and an area 606-2 in another color, as shown. Areas 608 include an area 608-1 in one color and an area 608-2 in another color.

Modeler 210 may instead assign colors for each cell of the grid representation by discretizes a narrow band around the surface of the input model. In this manner, the color data is discretized to within a narrow band around the surface while the interior areas are filled with a single color. This interior color can be set equal to a most-frequently-occurring color on an inner boundary of the narrow band. The size of the narrow band can be based on a characteristic of the exterior filament or the printer itself. This manner, in some cases, leads to faster printing as larger color areas (e.g., the interior color) can be printed more efficiently by many FDM 3D printers.

Modeler 210 may assign this interior color based on other factors, such as to a most-common color, a least-expensive color (e.g., if white filament is cheaper than black, assign it to the large, interior areas rather than black), or based on a printer speed being higher for one color of filament than another (e.g., the filament can be applied faster or a printer head having that color of filament is known, based on a history for the printer or specification for the printer indicating one printer head being faster than the other).

Further still, modeler 210 may assign colors to areas to improve print quality. For example, many FDM printers cause printing artifacts for short segments of filament or small areas. Modeler 210 may determine areas so as to avoid small areas or short segments, such as to determine the areas to be printed in each of the colors by assigning interior areas and surface areas such that each of the interior areas and the surface areas have at least a minimum size. This minimum size can be based on a characteristic of a specific type or individual printer, or a general characteristic common to FDM printers.

Returning to methods 400, at 412 printer instructions are determined based on the exterior perimeters and the areas for each slice of the input model. These printer instructions are capable of controlling printer heads of an FDM 3D printer effective to print a 3D object corresponding to the input model. This printed 3D object can be printed having the colors in an object surface of the 3D object corresponding to the surface of the 3D model.

Figure 7:
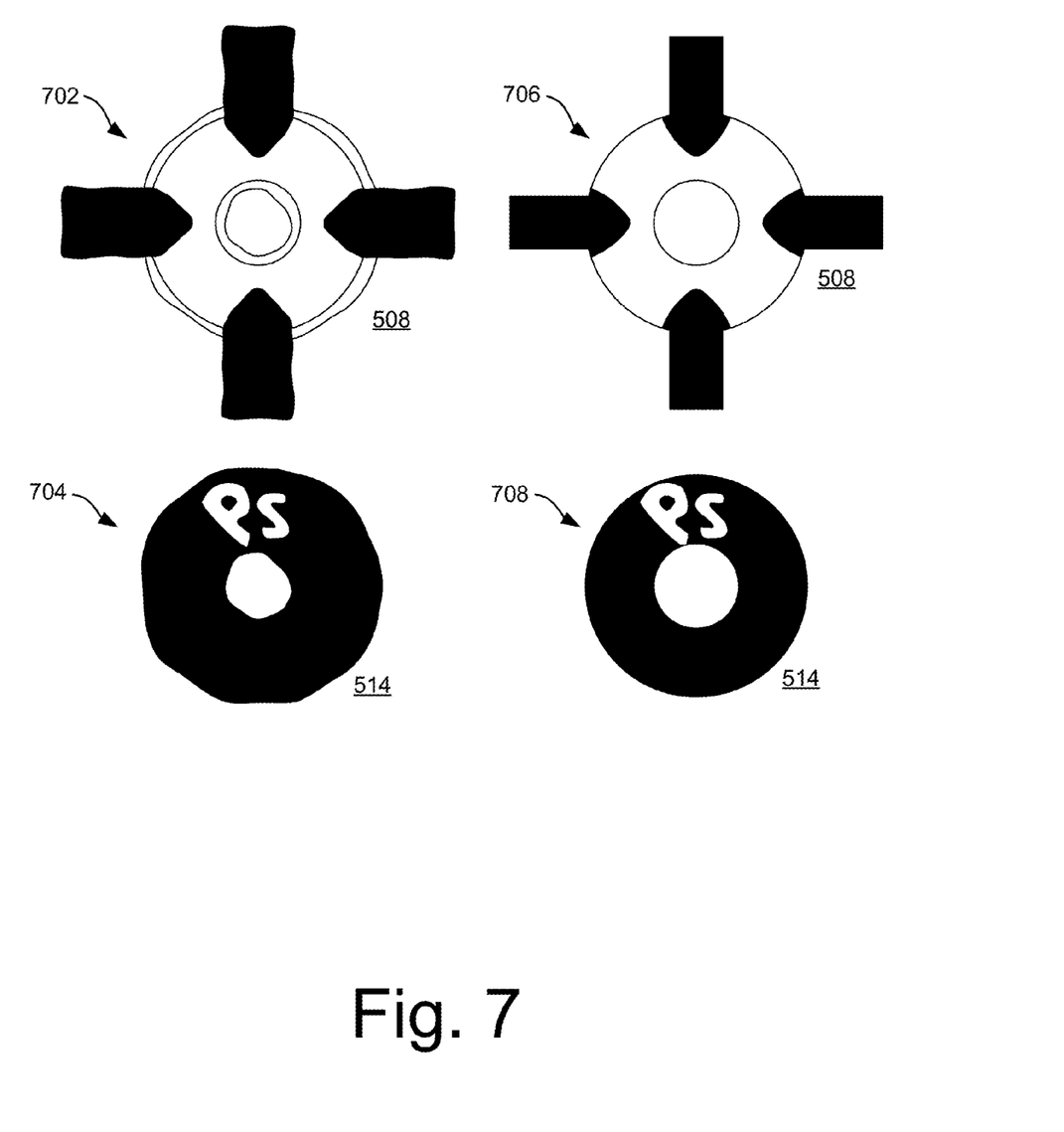
FIG. 7 illustrates pre-clipped discrete color representations and final color layers.

As part of determining printer instructions, modeler 210 can encode a movement for each printer head and for each layer printed for each slice. Doing so may involve converting portions of the areas into vector representations. Further, as part of or prior to determining the printer instructions, modeler 210 may avoid jagged areas on the boundaries between different color areas by converting the discretized colors into a vector representation by interpolating the color boundaries by polygons. Modeler 210 may also convert portions of the areas into vector representations by interpolating color boundaries at the portions by polygons and alter the polygons to reduce an overflow outside of the surface of the input model by intersecting the polygons with the exterior perimeters. In sum, modeler 210 can "clip off" overflowing portions based on the exterior perimeters using polygons. This is illustrated in FIG. 7 at pre-clipped discrete color representations 702 and 704 (based on areas 606 and 608 of FIG. 6, respectively) with the result shown at final color layers 706 and 708. Note that the colors conform to exterior perimeters 508 and 514 after clipping by modeler 210.

Optionally, at 414, a printer is caused to print a 3D object corresponding to the input model on which the printer instructions are based. Modeler 210 may cause a printer to printer the 3D object by providing the printer instructions to controller 104 of FIG. 1. By way of example, consider again 3D printer 102 of FIG. 1. Here printer instructions are received by 3D printer 102 from modeler 210 (which may be remote from 3D printer 102). In such a case, 3D printer 102, through controller 104, receives printer instructions for printing a 3D object. As noted, these printer instructions can have two or more colors in an object surface of the 3D object and be based on layer-by-layer printing, with at least one of the layers having the two or more colors. The controller 104 then follows these printer instructions to cause filament-providing element 106 to print the 3D object using two or more printer heads, with each printer head printing a different color corresponding to the colors of the object surface of the input model.

Figure 8:
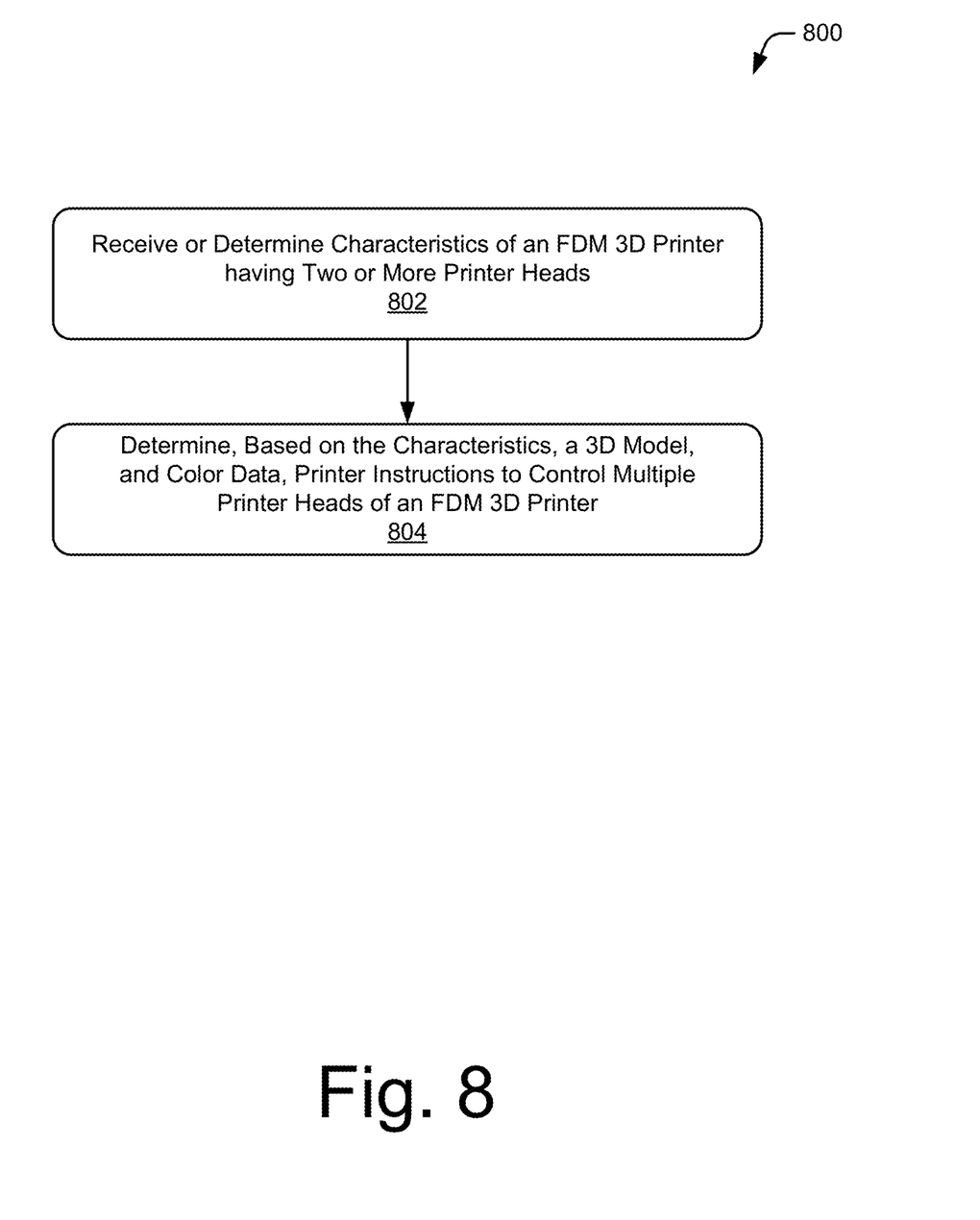
FIG. 8 illustrates example methods for determining printer instructions based on characteristics of printers.

With the above cases set forth, the discussion now turns to example methods 800 of FIG. 8 in which the techniques may determine printer instructions based on characteristics of printers. These methods 800 can operate separate from or augment methods 400 above.

At 802, the techniques receive or determine characteristics of an FDM 3D printer having two or more printer heads. These characteristics may include those of the filaments themselves, the printer heads, controller 104, and so forth. Example characteristics for filaments include viscosity, size, droop, cost, speed at which it can be applied, artifacts when printed in short segments, and so forth. Characteristics of printer heads include head speed, number of printer heads, ability to make small or large angular changes (e.g., 360 degree return without causing filaments errors), and height adjustments within a layer (e.g., to print non-horizontal layers). Characteristics of printers include, for example, those specified by a printer's manufacturer or those learned over prior use (e.g., one printer head is slower or more accurate than another).

At 804, printer instructions are determined, based on the characteristics, a 3D model, and color data for the 3D model that includes multiple colors, printer instructions for the printer heads of the FDM 3D printer. As noted, these printer instructions are capable of controlling two or more of the printer heads effective to print a 3D object corresponding to the 3D model and having at least two of the multiple colors of the color data in an object surface of the 3D object.

Figure 9:
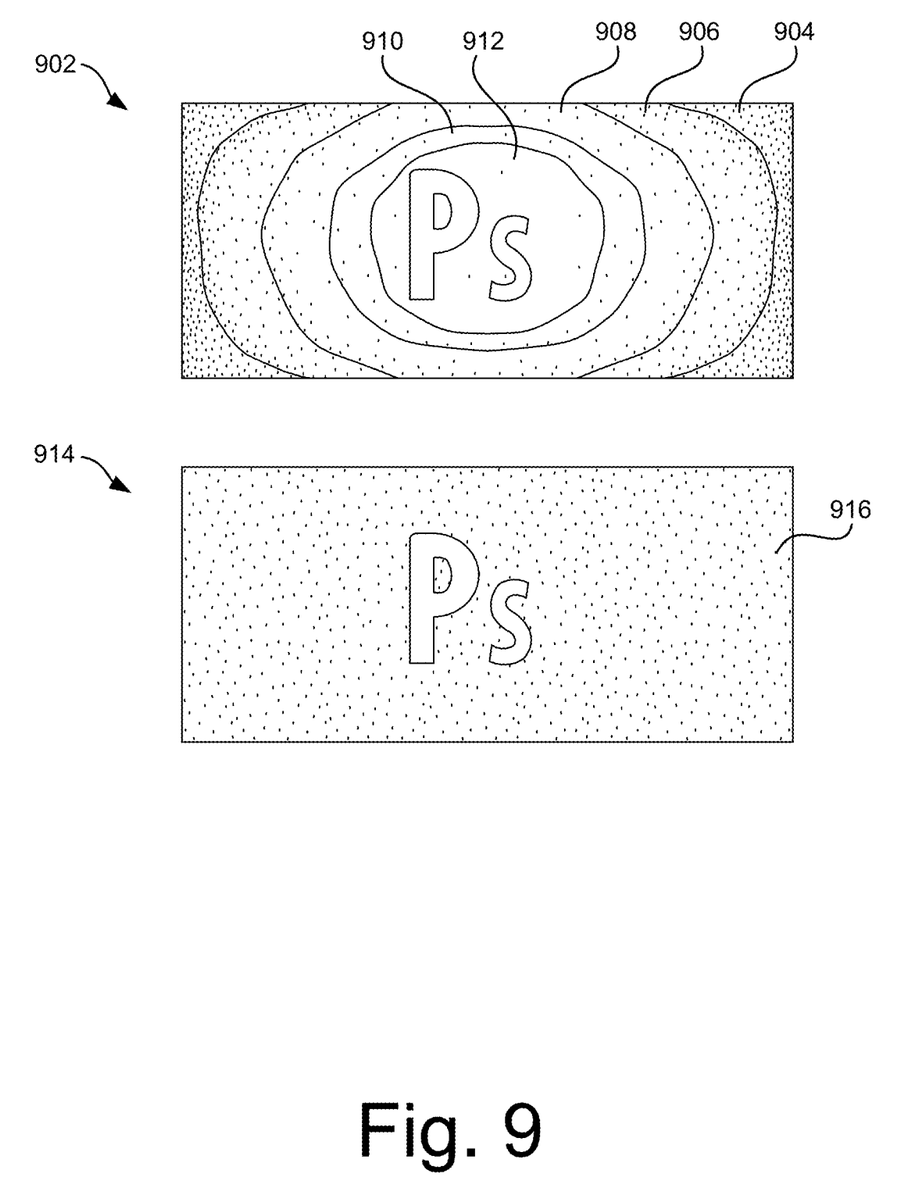
FIG. 9 illustrates color data having gradients of color and reduced-color data showing two colors only.

In some cases a characteristic of the intended printer affects how an input model is created. One such example is where a printer is not capable of printing all of the colors indicated in color data on which an input model is based. By way of example, consider FIG. 9, which illustrates color data 902 having gradients of color (shown with higher and lower densities of dots). Here assume that the "Ps" is yellow and that color region 904 is dark blue, color region 906 is medium blue, color region 908 is light blue, color region 910 is very light blue, and color region 912 is a blue-white (almost white). Assume also that the printer intended to print the object has two printer heads and, if filaments of various colors are available, can print in various blues and yellows. Color data 902 includes a greater number of colors than a number of the two printer heads, however. To address this, modeler 210 reduces the number of colors of color data 902 to the number of the printer heads—here two. This reduced-color data 914 shows two colors only, here assume the "Ps" is a same yellow and that modeled color region 916 is a medium blue. Modeler 210 may create this reduced-color data 914 in various manners. In one case modeler 210 reduces the colors to match available colors for a printer, such as the yellow to white and all of the blues to black if only black and white are available. If more options are possible, modeler 210 may reduce the colors to mean or median averages, such as to average the blues of 904-912 or to select a median of the blues (that of light blue for color region 908), so that the colors mapped are light blue and yellow for printing by a printer having color filaments available in these colors. The input model is then created (or altered) to have only these two colors by assigning reduce-color data 914 to the surface of the corresponding 3D model.

System-On-Chip

Figure 10:
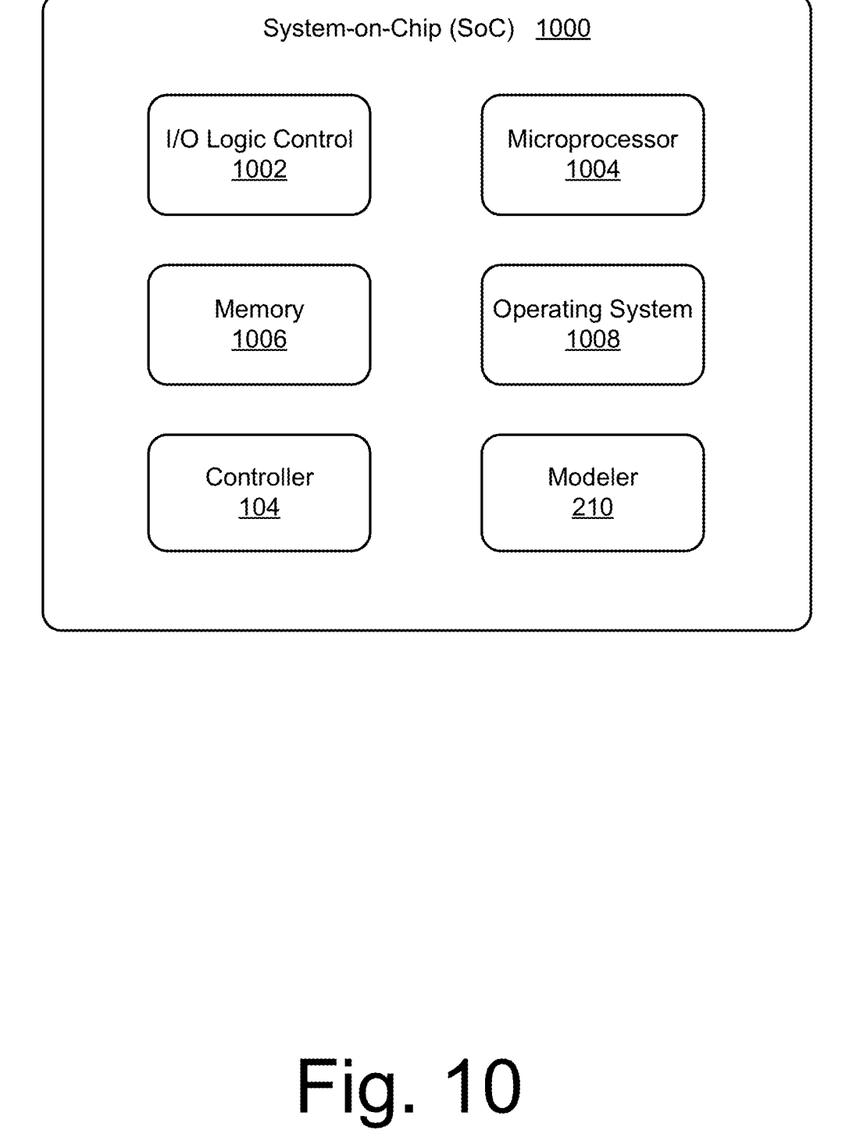
FIG. 10 illustrates a System-on-Chip (SoC) environment for implementing embodiments of the techniques described herein.

FIG. 10 illustrates a System-on-Chip (SoC) 1000, which can implement various embodiments described above. An SoC can be implemented in a fixed or mobile device of various types. SoC 1000 can be integrated with electronic circuitry, a microprocessor, memory, input-output (I/O) logic control, communication interfaces and components, other hardware, firmware, and/or software needed to run an entire device (e.g., 3D printer 102). SoC 1000 can also include an integrated data bus (not shown) that couples the various components of the SoC for data communication between the components. A device that includes SoC 1000 can also be implemented with many combinations of differing components.

In this example, SoC 1000 includes various components such as an input-output (I/O) logic control 1002 (e.g., to include electronic circuitry) and a microprocessor 1004 (e.g., any of a microcontroller or digital signal processor). SoC 1000 also includes a memory 1006, which can be any type of random access memory (RAM), a low-latency nonvolatile memory (e.g., flash memory), read only memory (ROM), and/or other suitable electronic data storage. SoC 1000 can also include various firmware and/or software, such as an operating system 1008, which can be computer-executable instructions maintained by memory 1006 and executed by microprocessor 1004. SoC 1000 can also include other various communication interfaces and components, wireless LAN (WLAN) or PAN (WPAN) components, other hardware, firmware, and/or software.

SoC 1000 includes controller 104 and/or modeler 210, which may include various components of FIG. 2 as well. Controller 104 and modeler 210 in SoC 1000, either independently or in combination with other entities, can be implemented as computer-executable instructions maintained by memory 1006 and executed by microprocessor 1004 to implement various embodiments and/or features described herein, such as 3D printing of colored models on multi-head printers. Controller 104 or modeler 210 may also be provided integral with other entities of the SoC. Alternatively or additionally, controller 104, modeler 210, and the other components can be implemented as hardware, firmware, fixed logic circuitry, or any combination thereof that is implemented in connection with the I/O logic control 1002 and/or other signal processing and control circuits of SoC 1000.

Although the subject matter has been described in language specific to structural features and/or methodological operations, the subject matter defined in the appended claims is not necessarily limited to the specific features or operations described above, including orders in which the operations are performed.

What is claimed is:

1. A computer-implemented method comprising:
   receiving an input model, the input model having a geometry of a three-dimensional (3D) model and color data indicating colors on a surface of the 3D model;
   slicing the input model effective to obtain, for each slice, exterior perimeters corresponding to the geometry of the 3D model;
   determining, for each slice and based on the exterior perimeters and the colors on the surface of the 3D model, areas to be printed in each of the colors, the determining the areas to be printed in each of the colors assigning interior areas based on a printer speed being higher for one color than another color and assigning the interior areas to the color having the higher printer speed; and
   determining, based on the exterior perimeters and the areas for each slice of the input model, printer instructions capable of controlling printer heads of a fused deposition modeling (FDM) 3D printer effective to print a 3D object corresponding to the input model, the 3D object having the colors in an object surface of the 3D object corresponding to the surface of the 3D model.

2. The method of claim 1, wherein the input model is a single input model for creation of the 3D object and determining the printer instructions determines printer instructions capable of controlling the multiple printer heads to create the 3D object layer-by-layer.

3. The method of claim 1, wherein slicing the input model is through a non-planar intersection of the input model, a result of the non-planar intersection used to determine the printer instructions including non-planar-layer printing.

4. The method of claim 1, wherein determining the areas to be printed in each of the colors includes converting data for the colors into a grid representation and assigning a color for each cell of the grid representation, the color assigned to interior cells of the grid representation being predominantly assigned to the color having the higher printer speed.

5. The method of claim 4, wherein assigning the color for each cell of the grid representation computes a nearest point on the surface of the input model for each cell of the grid representation.

6. The method of claim 4, wherein assigning the color for each cell of the grid representation discretizes a narrow band around the surface of the input model.

7. The method of claim 1, wherein assigning the interior areas based on a printer speed being higher for one color than another color determines that a most-frequently occurring color has a the higher printer speed based on the color being the most-frequently occurring color.

8. The method of claim 1, wherein assigning the interior areas based on a printer speed being higher for one color than another color determines which color has the higher printer speed based on a history for the printer heads having the respective colors.

9. The method of claim 1, wherein determining the areas to be printed in each of the colors assigns interior areas and surface areas such that each of the interior areas and the surface areas have at least a minimum size, the minimum size based on a characteristic of the FDM 3D printer in which areas smaller than the minimum size cause undesirable printing artifacts.

10. The method of claim 1, wherein determining the printer instructions encodes a movement for each printer head and for each layer printed for each slice by converting portions of the areas into vector representations.

11. The method of claim 10, wherein converting portions of the areas into vector representations interpolates color boundaries at the portions by polygons and further comprising altering the polygons to reduce an overflow outside of the surface of the input model by intersecting the polygons with the exterior perimeters.

12. The method of claim 1, further comprising:
receiving the 3D model and the color data associated with the 3D model; and
determining the input model from the 3D model and the color data, the geometry of the 3D model based on the 3D model and the colors of the surface of the 3D model based on the color data.

13. The method of claim 1, wherein assigning the interior areas based on a printer speed being higher for one color than another color determines which color has the higher printer speed based on a specification for the printer heads having the respective color.

14. One or more storage devices having instructions stored thereon that, responsive to execution by one or more computer processors, perform operations comprising:
receiving characteristics of a fused deposition modeling (FDM) three-dimensional (3D) printer having two or more printer heads; and
determining, based on the characteristics, a 3D model, and color data for the 3D model that includes multiple colors, the multiple colors being a greater number of colors than a number of the two or more printer heads determined from the characteristics of the FDM 3D printer, printer instructions for the printer heads of the FDM 3D printer, the printer instructions reducing the number of colors of the color data to the number of the two or more printer heads and capable of controlling two or more of the printer heads effective to print a 3D object corresponding to the 3D model and having at least two of the multiple colors of the color data in an object surface of the 3D object.

15. The one or more storage devices of claim 14, wherein the printer instructions are a single set of instructions for multiple colors.

16. The one or more storage devices of claim 14, wherein the color data is a two-dimensional (2D) image capable of being mapped onto a surface of the 3D model.

17. The one or more storage devices of claim 14, wherein reducing the number of colors of the color data reduces the colors to mean or media averages.

18. The one or more storage devices of claim 14, wherein the operation of determining the printer instructions:
determines, based on the 3D model and the color data, an input model having a geometry of the 3D model and colors of the color data; and
slices the input model into layers, each of the layers corresponding to a layer thickness included or determinable from the characteristics of the FDM 3D printer.

19. The one or more storage devices of claim 14, wherein reducing the number of colors of the color data assigns at least two of the greater number of colors to a single color of one of the two or more printer heads.

20. A fused-deposition modeling (FDM) three-dimensional (3D) printer comprising:
two or more printer heads, each of the printer heads capable of applying a filament for fused deposition printing;
one or more computer processors; and
computer-readable storage media having instructions stored thereon that, responsive to execution by the one or more computer processors, perform operations comprising:
receiving a 3D model and color data for the 3D model that includes multiple colors, the multiple colors being a greater number of colors than a number of the two or more printer heads of the FDM 3D printer;
determining printer instructions for the printer heads of the FDM 3D printer, the printer instructions reducing the number of colors of the color data to the number of the two or more printer heads; and
printing, based on the printer instructions, an object modeled by the 3D model, the printing with the reduced number of colors corresponding to the colors of the two or more printer heads.

21. The FDM 3D printer of claim 20, wherein determining printer instructions is further based on a surface geometry of the 3D model, the surface geometry having the multiple colors, and wherein printing the object prints an object surface of the object having the reduced number of colors.

22. The FDM 3D printer of claim 20, wherein determining printer instructions reducing the number of colors of the color data assigns at least two of the greater number of colors to a single color of one of the two or more printer heads.

23. The FDM 3D printer of claim 20, wherein determining printer instructions reducing the number of colors of the color data reduces the greater number of colors by determining a mean or median average of at least two of the greater number of colors and assigning the mean or media average to the at least two of the greater number of colors.

\* \* \* \* \*